United States Patent [19]

Hannon et al.

[11] 4,040,020

[45] Aug. 2, 1977

[54] BUBBLE LATTICE DEVICE

[75] Inventors: David Malcolm Hannon, Palo Alto; Hung Liang Hu, Sunnyvale, both of Calif.

[73] Assignee: International Business Machines Corporation, Armonk, N.Y.

[21] Appl. No.: 638,203

[22] Filed: Dec. 5, 1975

[51] Int. Cl.$^2$ .......................................... G11C 11/14
[52] U.S. Cl. .............................................. 340/174 TF
[58] Field of Search ................................. 340/174 TF

[56] References Cited

U.S. PATENT DOCUMENTS 3,974,487   8/1976   Watanabe et al. ............ 340/174 TF

FOREIGN PATENT DOCUMENTS 2,460,886   7/1975   Germany ...................... 340/174 TF Primary Examiner—James W. Moffitt
Attorney, Agent, or Firm—Joseph E. Kieninger

[57] ABSTRACT

A device adapted for use in a low externally applied magnetic field, for example, 15 Oe, with a bubble lattice system is described. The device has a Y shaped channel in which bubbles are propagated between a bubble lattice column and either detector means or generator means. The magnetic pattern surrounding the Y shaped channel is controlled to yield a self biasing magnetic field which enables the device to retain the advantages of the close bubble packing in a bubble lattice for the detection and generation operations.

14 Claims, 6 Drawing Figures

DIRECTION OF FIELD APPLIED GRADIENT

BUBBLE LATTICE DEVICE

FIELD OF THE INVENTION

This invention relates to bubble lattice system and more particularly to a device for use in the detection or generation of wall stated coded bubbles in a close packed array.

BRIEF DESCRIPTION OF PRIOR ART

Bubble domains arranged in lattice are described in copending U.S. patent application, Ser. No. 632,604 filed on Nov. 14, 1975 which is a continuation of U.S. patent application, Ser. No. 395,336 filed on Sept. 7, 1973 and now abandoned. As described therein, the bubble domain lattice consists of a plurality of rows and columns of bubble domains which occupy a spatial arrangement which is determined to a substantial extent by the interaction between the bubbles.

Column accessing of bubble domains in a lattice are described in copending U.S. patent application Ser. No. 429,601 filed on Jan. 2, 1974 and assigned to the assignee of the present invention. As described therein, means and a method are provided for removing the elements in a direction substantially transverse to the direction of the translational movement within the confined array. Columns of magnetic bubble domains in the lattice array of bubble domains can be accessed with this technique. After the bubbles have been accessed from the bubble lattice they are translated to a read station. At the read station means are employed to detect the difference in the bubbles which have been coded in terms of the wall magnetization rotation. This type of coding is described in more detail in U.S. Pat. No. 3,890,605, which issued on June 17, 1975. Briefly, magnetic bubbles can be made to deflect through different angles in a gradient magnetic field normal to the magnetic medium depending on the number of rotations of their wall magnetization. Thus, means are described so that the column access channel from the bubble lattice leads into a Y shaped channel in order to allow the bubble domains to be deflected into either one of the legs of the Y shaped channel. Sensors then detect the bubble domains and an indication is obtained of the information contained within the lattice. In such a system the bubble lattice portion requires an externally applied bias field between 0 and 0.2 ($4\pi Ms$) for example, 15 Oe, whereas Y shaped channel and the bubble sensors use isolated bubbles which require a much higher bias field, for example, of the order of 60 to 64 Oe in the case of 5$\mu$m bubbles. Translating bubbles in a bubble lattice of 5$\mu$m bubbles with an external bias field of 15 Oe and translating 5 um bubbles outside a lattice to a detector in an isolated bubble mode requiring an external bias field of 60 Oe is not practical for a commercial memory device.

One approach to overcome this problem has been to have the thickness of the magnetic material used for the bubble lattice of 5$\mu$m bubbles at a certain thickness, for example, 3.5 microns, and have the material thickness used in the channels going to the detector region at a thinner thickness, for example, 1.5 to 2.5 microns thick. In such a case the bias field requirement of about 60 Oe for 3.5 micron thickness decreases for the thinner channels to about 46 Oe for 2.5 microns and about 38 Oe for 1.5 micron thickness. While this approach is an improvement over the prior art method described earlier, it also has some disadvantages. For example, thinning down the film of magnetic material requires one level of registration with a corresponding fabrication step. The different thickness steps of the film also may cause a change in the wall state.

Another disadvantage is that the use of detection in an isolated bubble mode nullifies the advantages, for example, wide operating margins, that a close pack bubble lattice configuration has over the isolated bubble T & I bar type devices.

SUMMARY OF THE INVENTION

It is a primary object of this invention to provide an improved bubble lattice device.

It is another object of this invention to provide a close pack bubble state detector.

It is still another object of this invention to provide a close pack bubble generator.

It is yet another object of this invention to provide a device suitable for use with lattices in the presence of a relatively low externally applied bias field.

It is yet still another object of this invention to provide a device having a film thickness substantially the same film thickness as bubble lattice device.

These and other objects are accomplished by a device having a Y shape configuration which is surrounded by a magnetic pattern which yields a self biasing field. This device may be used with a sensor to detect the state of the bubbles. It may also be used in combination with a generator to supply bubbles of a particular state to the lattice.

Other objects of this invention will be apparent from the following detailed description, reference being made to the accompanying drawings wherein preferred embodiments of the invention are shown.

BRIEF DESCRIPTION OF THE DRAWINGS

FIG. 1 is a detailed diagram of the device in accordance with this invention having a bubble lattice provide the self biasing field.

DESCRIPTION OF THE ILLUSTRATIVE EMBODIMENT

Figure 1A:
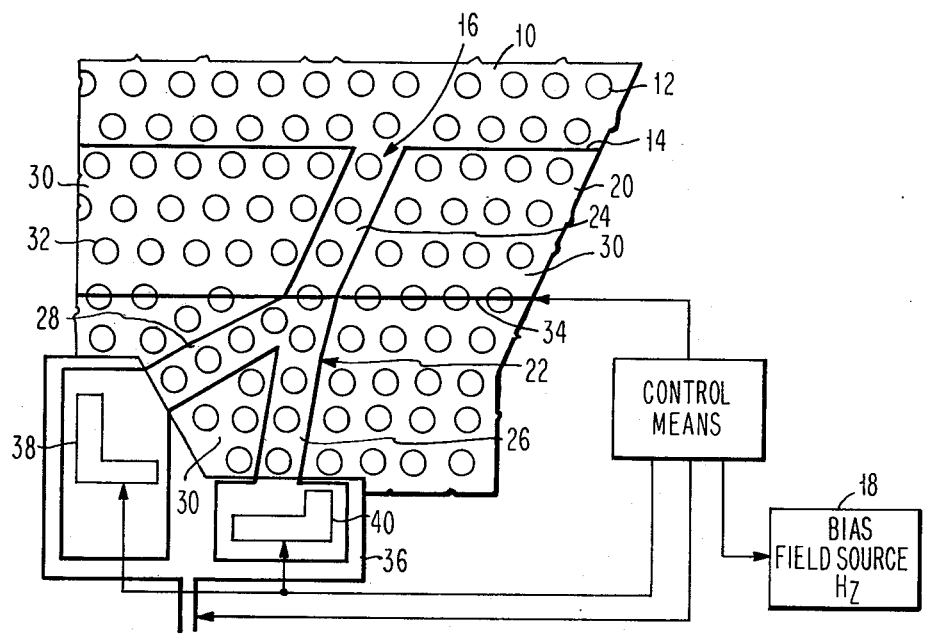
FIG. 1A illustrates the angular alignment of the channels with the applied gradient field.
Figure 1A:
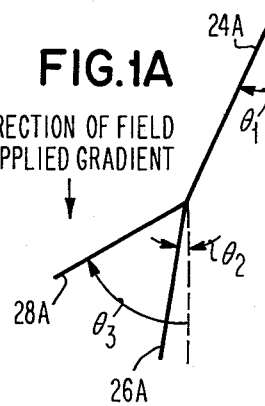

As shown in FIG. 1, a portion 10 of a bubble lattice contains coded bubbles 12. The bubbles 12 contain bits of storage information which are represented by different states of the bubble, for example, an S=0 bubble, that is, a bubble containing one pair of Bloch lines and an S=1 bubble, containing no Bloch lines. The bubble lattice 10 is confined by a barrier 14. The barrier 14 may be a dam, groove, conductor or any other well known barriers as is used in the art. The barrier 14 has an opening 16 which permits bubbles to be translated into or out of a particular column in the lattice 10. An external bias field source 18 provides an external bias field about the bubble lattice 10 of between 0 and 0.2 ($4\pi M_s$), wherein $M_s$ is the magnetization of the bubble film material. Typically, for 5$\mu$m bubbles the bias field is of the order of 0 to 30 Oe with the preferred value being about 15 Oe.

Figure 1B:
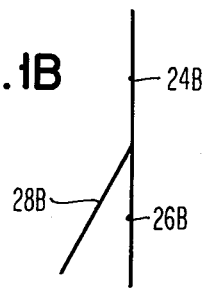
FIG. 1B illustrates an alternative alignment of the three channels in the Y shaped channel.

In accordance with this invention a device 20 includes a film of material suitable for formation of bubble domains therein which contains a Y shaped propagation channel 22. The Y shaped channel 22 consists of channel 24, channel 26 and channel 28. One end of channel 24 is connected to the opening 16 of the bubble lattice system 10. The other end of channel 24 branches into channel 26 and channel 28. Channels 24, 26 and 28 are aligned at an angle to the direction of the applied gradient field and will be more fully described in FIG. 1A. The angle of channels 26 and 28 with respect to channel 24 may vary to some extent. An example is shown in FIG. 1B which will be herinafter fully described.

Figure 2:
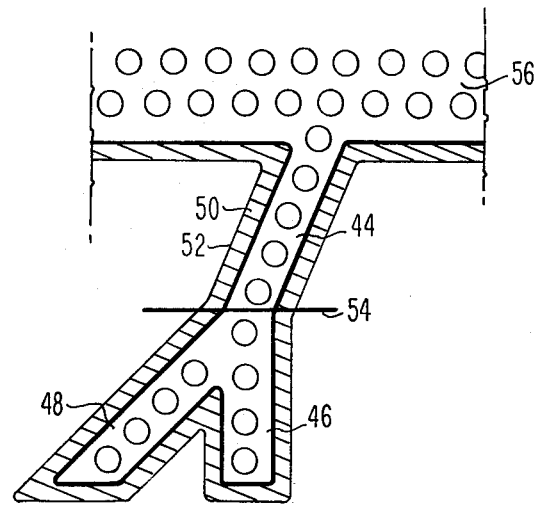
FIG. 2 illustrates another embodiment of the device wherein a stripe domain provides the self biasing field.
Figure 3:
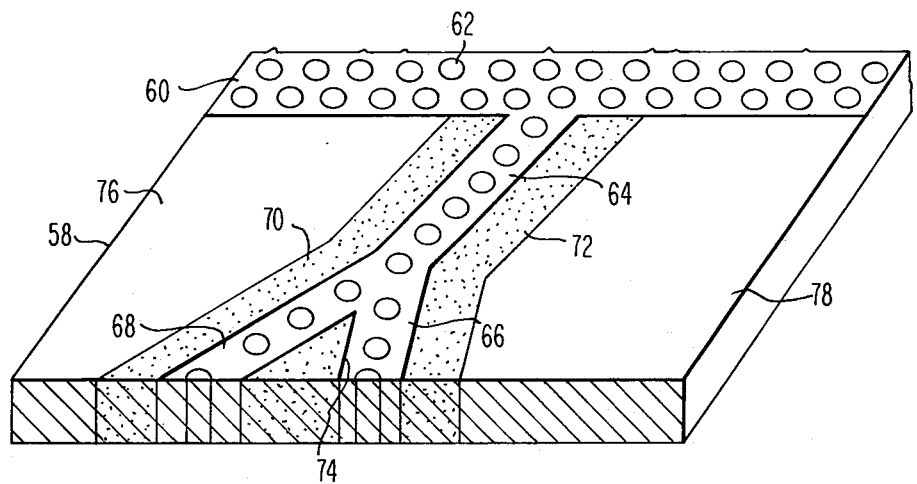
FIG. 3 is another embodiment of the device wherein the self biasing field is provided by a region in which the magnetism has been entirely destroyed.
Figure 4:
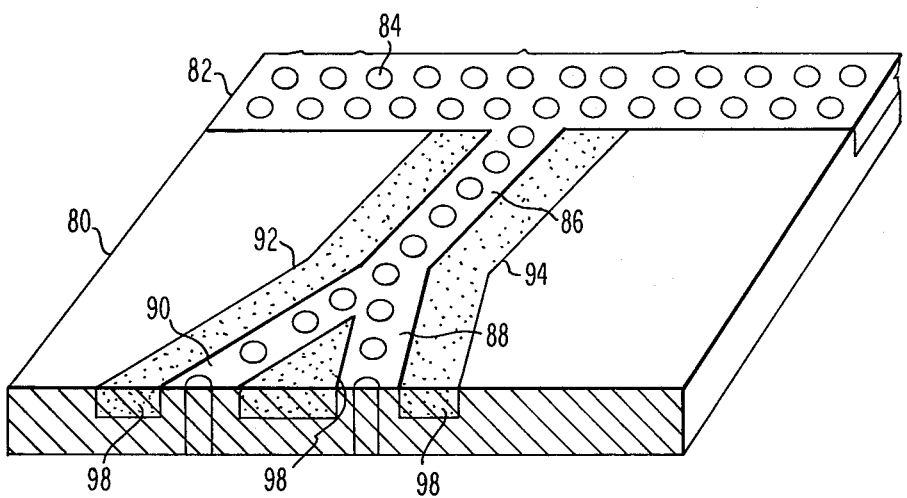
FIG. 4 is another embodiment of this device wherein the self biasing field is provided by a region in which the magnetization has been destroyed to a certain depth.

Surrounding the channels 24, 26 and 28 is a self-biasing lattice 30 containing bubbles 32. The state of the bubbles 32 is not important since the primary purpose of these bubbles are to provide a self biasing field about the channel 22. The presence of the self biasing field, that is, arising from the lattice 30 in this embodiment is of particular importance in the successful operation of this device. It is the presence of this self biasing field which keeps the bubbles from becoming stripes at a relatively low bias field, for example, 15 Oe, which is substantially lower than that 60 Oe required in an isolated bubble scheme. The source of the self biasing field in FIG. 1 is the lattice 30. Other sources of self biasing fields may be a stripe domain as shown in FIG. 2, or by changes in the magnetization of the material adjacent the channels as shown in FIG. 3 and 4 which will be more fully discussed hereinafter.

Positioned across the end of the channel 24 where it branches into channels 26 and 28 is a conductor 34 which is used for gating purposes. Although only one conductor is shown it is understood that, if preferred, the gating can be done with more than one conductor. A conductor 36 serves as a gating conductor as well as a bubble annihilating conductor. A magnetoresistor detector 38 is placed at the end of the channel 28. Similarly, a magnetoresistor detector 40 is placed at the end of channel 26.

In operation bubbles 12 in the bubble lattice 10 in the column positioned at opening 16 are translated by conventional means into the channel 24. The state of the bubbles are S=0 or S=1 depending upon the coded information. The conductor means 34 serves as a gate to channel 24. As a bubble is introduced into the channel 24 a bubble crosses conductor 34 into channel 26 or 28 depending on the state thereof. It is understood that the conductor 34 can be energized to move a bubble by itself into channel 26 or 28. As described in U.S. Pat. No. 3,890,605, magnetic bubbles deflect through different angles in a gradient magnetic field normal to the magnetic medium depending on the bubble state, that is, the number of rotation of wall magnetization. For example, bubbles having an S=1 state would be deflected into channel 28 whereas bubbles having an S=0 state would be deflected into channel 26. Channels 24, 26 and 28 are filled with bubbles. As one bubble enters channel 24, a bubble leaves channel 24 and enters either channel 26 or 28 depending upon the state thereof. When a bubble enters a channel 26 or 28, a bubble is pushed out of the other end of that channel into the manetoresistor 28 or 40 as the case may be where the presence or absence of the bubble indicates the state of the bubble leaving channel 24.

The length of channels 24, 26 and 28 is not critical. For practical purposes the length of channels 26 and 28 are such that it is preferred that they contain four bubbles or less. In some cases, it may be desirable not to have any bubbles in either channels 26 or 28. In such an embodiment the bubble would go immediately from the conductor gate 34 to one of the magnetoresistor detectors 38 or 40. The bubble lattice 10 and the device 20 operate in an externally applied bias field of the order of 0 to 30 Oe with a preferred value being about 15 Oe. The presence of the bubbles in the biasing lattice 30 provide a self biasing environment which maintains the integrity of the bubbles in the channel 22 under this relatively low externally applied bias field. This self biasing field is substantially decreased in the detectors 38 and 40. Hence a bubble leaving channel 26 and 28 and the self biasing field surrounding these channels will stripe out after it passes conductor 36 thereby making it easy to be sensed by the detectors 38 and 40. The conductor 36 is used to clear the stripes that are in the detectors 38 and 40 after their presence has been sensed by either annihilation or retraction out of the detector.

The biasing field is balanced around the end of channel 24 so as to not unduly affect the deflection angle of the bubble as it leaves channel 24 into either channel 26 or 28. By having a balanced self biasing field around the end of channel 24, the channel the bubble goes into, that is, channel 26 or channel 28, will be entirely dependent upon the deflection angle of the bubble which is dependent upon its state. While it is not a requirement that the self biasing field about channels 26 and 28 and the upper end of 24 be balanced, in the preferred embodiment the self biasing field is also balanced around these channels.

In FIG. 1 magnetoresistor detectors 38 and 40 are positioned at the end of channels 26 and 28 in order to read the bubbles. In another embodiment of this invention the detectors 38 and 40 may be replaced with generators (not shown) at the ends of channels 26 and 28 so as to serve as a write station and generate the appropriate bubbles which are fed into channels 26 and 28 and through channel 24 directly into the bubble lattice. In such an embodiment the requirement of having a balanced self biasing field about the end of channel 24 near conductor 30 is less critical.

In FIG. 1A a schematic diagram of the channel 24A as it branches into channels 26A and 28A is shown. The angle that these channels form with the direction of the applied gradient field is $\theta 1$ for channel 24A, $\theta 2$ for channel 26A and $\theta 3$ for channel 28A. In a preferred embodiment $\theta 1 = (\theta 3 + \theta 2)/2$.

In FIG. 1B channel 26B is aligned substantially straight with channel 24B. The channel 28B is aligned at an angle with 24B. In this embodiment bubbles having an S=0 state will leave 24B and go to 26B whereas bubbles having an S=1 state will go into channel 28B.

As shown in FIG. 2 channel 44 branches into channel 46 and 48. Channels 44, 46 and 48 are surrounded by a stripe domain 50 which supplies the self biasing field. The stripe domain 50 is confined on one side by the channel and on the other side by a confining means 52 which may be a dam, groove or other confinement means well known in the art. Conductor 54 is positioned across the region where channel 44 branches into channels 46 and 48. The bubble lattice 56 is positioned above channel 44 in a manner similar to FIG. 1. Detector means and conductor means at the ends of channels 46 and 48 are not shown. Stripe domain 50 may be provided in any of the methods well known in the art. In addition, the stripe domain 50 may pass around the bubble lattice 56 if desired, although it is not necessary. If desired, more than one stripe domain 50 may be used.

As shown in FIG. 3 the self biasing field may be provided by a region surrounding the channels in which the magnetism has been destroyed. The film 58 of material capable of supporting bubble domains has the bubble lattice in region 60 containing bubble domains 62. Channels 64 branches into channel 66 and 68. In the region 70, 72 and 74 which surrounds channels 64, 66 and 68 the magnetism has been destroyed by having ion implanting, ion milling, or other means well known in the art. The region 76 and 78 have not had their magnetism destroyed. The difference in the magnetization of the regions 70, 72 and 74 and the region in the channels 64, 66 and 68 provide a self biasing field about the channels 64, 66 and 68. The conductors, generators or detectors have not been shown in this figure.

Another embodiment showing a different bias field is shown in FIG. 4. In this drawing a film 80 capable of supporting bubble domains has a region 82 containing a bubble lattice with bubbles 84. A channel 86 branches into channel 88 and channel 90. The regions 92, 94 and 96 immediately adjacent channel 86, 88 and 90 have had the magnetism therein destroyed to a certain depth 98. The difference in the magnetization of the material adjacent the channels and the remaining region provides a self biasing field about the channels.

Although several preferred embodiments of this invention have been described, it is understood that numerous variations may be made in accordance with the principles of this invention.

What is claimed:

1. A device adapted for use with a bubble lattice system in an external bias field between 0 and 0.2 ($4\pi M_s$) comprising
   a first channel associated with a bubble lattice, said channel having an end,
   a second channel having a first end and a second end, said first end connected to said first channel end wherein a bubble having an S=0 state leaving said first channel moves into said second channel,
   a third channel being aligned at an angle with said first channel, said third channel having a first end and a second end, said third channel first end connected to said first channel end wherein a bubble having an S=1 state leaving said channel moves into said third channel, and
   a self biasing field around said first channel and being substantially balanced around the region where said first channel joins said second channel first end and said third channel first end.

2. A device as described in claim 1 wherein said second channel being in substantial straight alignment with said first channel.

3. A device as described in claim 1 wherein said second channel being aligned at an angle with said first channel.

4. A device as described in claim 1 wherein said self biasing field is provided by a bubble lattice.

5. A device as described in claim 1 wherein said self biasing field is provided by at least one stripe domain.

6. A device is described in claim 1 wherein the self biasing field is provided by a layer of magnetic material adjacent said first channel end which has less magnetization than that of the channels.

7. A device as described in claim 1 wherein the self biasing field is provided by material free of magnetism about said channels.

8. A device adapted for use with a bubble lattice system in an external bias field between 0 and 0.2 ($4\pi M_s$) comprising
   a first channel associated with a bubble lattice, said channel having an end,
   a second channel having a first end and a second end, said first end connected to said first channel end wherein a bubble having an S=0 state leaving said first channel moves into said second channel,
   a third channel being aligned at an angle with said first channel, said third channel having a first end and a second end, said third channel first end connected to said first channel end wherein a bubble having an S=1 state leaving said first channel moves into a said third channel,
   a self biasing field around said first channel, said second channel and said third channel, said self biasing field being substantially balanced around the region where said first channel end joins said second channel first end and said third channel first end, and
   a first conductor means positioned across first channel end.

9. A device as described in claim 8 including a second conductor means positioned across said second end of said second channel.

10. A device as described in claim 9 including detector means at the end of said second end of said second channel.

11. A device as described in claim 8 including a third conductor means positioned across second end of said third channel wherein said conductor means.

12. A device as described in claim 11 including detector means at the end of said second end of said third channel.

13. A device adapted for use with a bubble lattice system in an external bias field between 0 and 0.2 ($4\pi M_s$) comprising
   a first channel associated with a bubble lattice, said channel having an end,
   a second channel having a first end and a second end, said first end connected to said first channel end wherein a bubble having an S=0 state leaving said first channel moves into said second channel,
   a third channel being aligned at an angle with said first channel, said third channel having a first end and a second end, said third channel first end connected to said first channel end wherein a bubble having an S=1 state leaving said first channel moves into said third channel,
   a self biasing field around said first channel and being substantially balanced around the region where said first channel end joins said second channel first end and said third channel first end, and
   detector means associated with at least one of said second channel and said third channels.

14. A device adapted for use with a bubble lattice system in an external bias field between 0 and 0.2 ($4\pi M_s$) comprising
   a first channel associated with a bubble lattice, said channel having an end,
   a second channel having a first end and a second end, said first end connected to said first channel end,
   a third channel having a first end and a second end, said third channel first end connected to said first channel end,
   a self biasing field around said first channel, said second channel and said third channel, and
   generator means associated with said second channel and said third channel.

* * * * *